United States Patent
Kanamaru et al.

(10) Patent No.: US 9,064,522 B2
(45) Date of Patent: Jun. 23, 2015

(54) STAMPER AND METHOD OF MANUFACTURING BIT PATTERNED MEDIUM USING STAMPER

(71) Applicant: KABUSHIKI KAISHA TOSHIBA, Minato-ku, Tokyo (JP)

(72) Inventors: Masahiro Kanamaru, Kawasaki (JP); Yoshiyuki Kamata, Tokyo (JP); Ryosuke Yamamoto, Kawasaki (JP); Takeshi Okino, Yokohama (JP); Akira Kikitsu, Yokohama (JP); Katsuya Sugawara, Yokohama (JP); Yasuaki Ootera, Yokohama (JP); Tomoyuki Maeda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/167,464

(22) Filed: Jan. 29, 2014

(65) Prior Publication Data
US 2014/0374380 A1 Dec. 25, 2014

(30) Foreign Application Priority Data
Jun. 24, 2013 (JP) ................ 2013-131257

(51) Int. Cl.
*G11B 5/09* (2006.01)
*G11B 5/82* (2006.01)
(Continued)

(52) U.S. Cl.
CPC .............. *G11B 5/855* (2013.01); *G11B 5/746* (2013.01); *G11B 5/82* (2013.01); *B29C 33/00* (2013.01);
(Continued)

(58) Field of Classification Search
CPC .......... G11B 5/865; G11B 5/82; G11B 5/746; G11B 5/855; G11B 5/743; G11B 5/59688; B82Y 10/00; B29C 33/3857; B29C 45/372
USPC .................. 360/15, 71, 48, 135, 75; 425/385; 216/44, 22; 430/320, 296, 323
See application file for complete search history.

(56) References Cited

U.S. PATENT DOCUMENTS 8,059,350 B2 * 11/2011 Albrecht et al. ................ 360/48
8,300,340 B2 * 10/2012 Sakurai et al. .................. 360/48
(Continued)

FOREIGN PATENT DOCUMENTS

JP 2011-210330 A 10/2011
JP 2011-233210 A 11/2011
(Continued)

OTHER PUBLICATIONS

Notice of Reasons for Rejection issued by the Japanese Patent Office on Aug. 5, 2014, for Japanese Patent Application No. 2013-131257, and English-language translation thereof.
(Continued)

*Primary Examiner* — Ali Neyzari
(74) *Attorney, Agent, or Firm* — Finnegan, Henderson, Farabow, Garrett & Dunner, L.L.P.

(57) ABSTRACT

A stamper of an embodiment includes: a base portion having a main surface; and a plurality of guides arranged on the main surface in mutually different first and second directions and serving as references of arrangement of a plurality of self-assembled dots. A distance between the guides in a third direction is within a range of an integer $m_1$ ±0.05 times of a pitch of the plural self-assembled dots. The third direction corresponds to a third vector obtained by combining a first vector corresponding to the arrangement of the guides in the first direction and a second vector corresponding to the arrangement of the guides in the second direction. A distance between the plural guides in the first direction falls out of a range of an integer $m_2$ ±0.15 times of the pitch of the plural self-assembled dots.

11 Claims, 17 Drawing Sheets

(51) Int. Cl.
  *G11B 5/855*   (2006.01)
  *G11B 5/74*    (2006.01)
  *B29C 33/00*   (2006.01)
  *G03F 7/00*    (2006.01)
  *H01L 21/768*  (2006.01)
  *B29C 33/38*   (2006.01)
  *B29C 45/37*   (2006.01)
  *B29C 33/42*   (2006.01)

(52) U.S. Cl.
  CPC ........ *G03F 7/0002* (2013.01); *H01L 21/76817* (2013.01); *B29C 45/372* (2013.01); *B29C 33/3857* (2013.01); *B29C 2033/426* (2013.01)

(56) References Cited

U.S. PATENT DOCUMENTS

| | | | |
|---|---|---|---|
| 8,654,475 B2 * | 2/2014 | Okino | 360/71 |
| 8,673,541 B2 * | 3/2014 | Xiao et al. | 430/296 |
| 8,896,951 B2 | 11/2014 | Okino et al. | |
| 2011/0267718 A1 | 11/2011 | Itakura et al. | |
| 2012/0107583 A1 | 5/2012 | Xiao et al. | |
| 2012/0276414 A1 | 11/2012 | Maeda et al. | |
| 2013/0077191 A1 * | 3/2013 | Okino et al. | 360/135 |
| 2014/0030554 A1 * | 1/2014 | Kikitsu et al. | 428/836 |

FOREIGN PATENT DOCUMENTS

| | | |
|---|---|---|
| JP | 2012-099209 A | 5/2012 |
| JP | 2012-234596 A | 11/2012 |
| JP | 2013-73633 A | 4/2013 |

OTHER PUBLICATIONS

Notice of Reasons for Rejection issued by the Japanese Patent Office on Jan. 27, 2015, for Japanese Patent Application No. 2013-131257, and English-language translation thereof.

* cited by examiner

US 9,064,522 B2

STAMPER AND METHOD OF MANUFACTURING BIT PATTERNED MEDIUM USING STAMPER

CROSS REFERENCE TO RELATED APPLICATION

This application is based upon and claims the benefit of priority from Japanese Patent Application No. 2013-131257 filed on Jun. 24, 2013; the entire contents of which are incorporated herein by reference.

FIELD

Embodiments described herein relate generally to a stamper and a method of manufacturing a bit patterned medium using the stamper.

BACKGROUND

As a magnetic recording medium (for example, a magnetic disk (also called a hard disk)) comes to have higher density, there has been proposed what is called bit patterned media (hereinafter referred to as "BPM"). In BPM, since magnetic dots for magnetic recording are divided by nonmagnetic substances, deterioration in magnetic signal due to thermal fluctuation can be reduced.

As a method of fabricating BPM, there has been proposed a method to obtain magnetic dot patterns by forming self-assembled dots with the use of self-assembly performance of block copolymer and processing the dots.

Here, it is not easy to orderly arrange the self-assembled dots over a wide area. Therefore, there has been proposed a method to control the disposition of self-assembled dots by guide patterns (hereinafter, referred to as "post guides") in a columnar shape or the like.

However, it is not necessarily easy to dispose the post guides for controlling the arrangement of the dots over a wide area without increasing accuracy and density of the post guides.

DETAILED DESCRIPTION

A stamper of an embodiment includes: a base portion having a main surface; and a plurality of guides arranged on the main surface in mutually different first and second directions and serving as references of arrangement of a plurality of self-assembled dots. A distance between the guides in a third direction is within a range of an integer $m_1$ ±0.05 times of a pitch of the plural self-assembled dots. This third direction corresponds to a third vector obtained by combining a first vector corresponding to the arrangement of the guides in the first direction and a second vector corresponding to the arrangement of the guides in the second direction. A distance between the plural guides in the first direction falls out of a range of an integer $m_2$ ±0.15 times of the pitch of the plural self-assembled dots.

Hereinafter, the embodiment will be described in detail with reference to the drawings.

Figure 1:
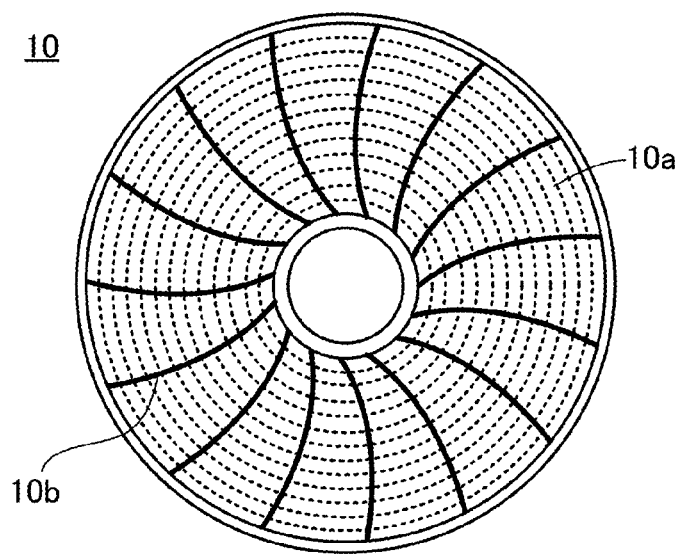
FIG. 1 is a view illustrating a magnetic recording medium according to an embodiment.

A magnetic recording medium will be described. FIG. 1 is a schematic view illustrating a magnetic disk 10 as an example of the magnetic recording medium according to the embodiment.

The magnetic disk 10 is used as a magnetic recording medium for magnetically recording and reproducing information in a magnetic recording and reproducing apparatus. Information is magnetically recorded on a magnetic recording layer 32a disposed on one surface or both surfaces of the magnetic disk 10 (refer to later-described FIG. 4F).

The magnetic disk 10 according to the embodiment has a doughnut shape. Since the magnetic disk 10 is rotated during the magnetic recording and reproduction, it is generally preferable that the magnetic disk 10 has a disk shape, in particular, a doughnut shape.

Here, the size of the magnetic disk 10 is not particularly limited from the viewpoint of its method. However, in order to prevent the drawing time by a later-described electron beam (the time for creating a stamper) from becoming too long, the size is desirably 3.5 inch or less. Further, in order to prevent a pressing force required at the time of later-described imprinting from becoming too large, the size is desirably 2.5 inch or less.

The inside of the magnetic disk 10 is divided into concentric tracks 10a having a circular cross section, and the tracks 10a each have sectors demarcated at every predetermined angle. The magnetic disk 10 is attached to a spindle motor of the magnetic recording and reproducing apparatus to be rotated, and various kinds of digital data are recorded and reproduced by a head. Therefore the tracks 10a for user data are disposed in a circumferential direction.

Servo marks 10b for position control are disposed in a direction crossing the tracks 10a. The servo marks (servo areas) 10b each include areas such as a preamble part, an address part, and a burst part, and when necessary, a gap part is provided. Number information of a track or a sector is written to the address part. The burst part is an area for detecting a relative position of the head with respect to the track 10a.

Note that the servo mark (servo area) 10b does not necessarily have to be disposed at one place (one angular range) in a sector. That is, the servo mark 10b may be disposed at a plurality of places in one sector. In this case, for the purpose of synchronization, sync marks extending in a radial direction are disposed at a plurality of places in the sector.

As the magnetic disk 10, BPM in which magnetic dots for magnetic recording are divided by nonmagnetic substances is usable. The BPM can be fabricated by imprinting using stampers (molds).

The stampers are later-described father stamper 14, father stamper 15, and resin stamper 16, and they each have a base portion (flat plate portion) having a main surface and guides (post guides) G disposed on the main surface (refer to later-described FIG. 2E, FIG. 2F, FIG. 3A, and FIG. 5). The post guides G are either projections or pits on the main surface of the base portion.

The stampers are molds of the magnetic disk 10 and therefore have areas corresponding to an internal structure of the magnetic disk 10. That is, the stampers have, for example, data areas and servo areas. A set of the data area and the servo area corresponding thereto is a sector. The data area has a plurality of concentric zones (tracks). The servo area includes a preamble part for synchronization, an address part in which a servo address is written, a burst part for position control, and so on.

In the data area, post guide patterns composed of a plurality of post guides P are provided (refer to later-described FIG. 5). With the post guides P serving as references, dots D of diblock copolymer are arranged orderly, ideally, in a hexagonal crystal form. Accordingly, the post guide patterns are also disposed in a hexagonal crystal form. Besides the post guides P, guide extension portions may be extended in the circumferential direction. Details of the post guides P will be described later.

Similarly to the magnetic disk 10, the stamper may have a disk shape, a doughnut shape, or other shape. A thickness of the stamper is desirably not less than 0.1 mm nor more than 2 mm. When the thickness is too small, strength cannot be obtained. On the other hand, when the thickness is larger than necessary, it takes time for later-described electroforming or its film thickness greatly varies. The stamper is preferably larger in size than the magnetic recording medium, but its size is not particularly limited.

Next, a method of manufacturing the magnetic recording medium using the stamper of this embodiment will be described (refer to FIG. 2A to FIG. 2F, FIG. 3A to FIG. 3F, and FIG. 4A to FIG. 4F).

Figure 2A:
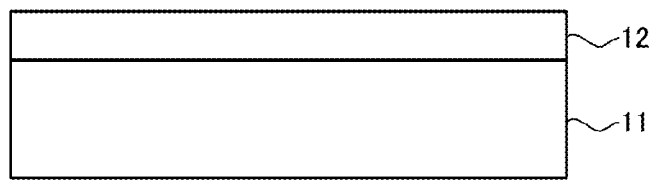
FIG. 2A is a view illustrating a manufacturing process of the magnetic recording medium.
Figure 2B:
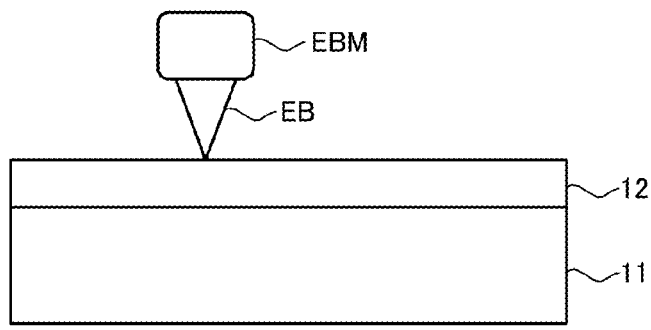
FIG. 2B is a view illustrating a manufacturing process of the magnetic recording medium.
Figure 2C:
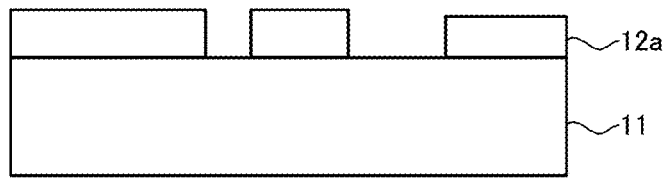
FIG. 2C is a view illustrating a manufacturing process of the magnetic recording medium.

(1) Formation of Resist Pattern 12a (Refer to FIG. 2A to FIG. 2C)

A photosensitive resin (hereinafter, referred to as a resist) 12 is applied on a substrate 11 (refer to FIG. 2A). The resist 12 is exposed by an electron beam EB with the use of an electron beam drawing machine EBM as illustrated in FIG. 2B (electron beam drawing).

At this time, latent images of the post guide patterns and the servo patterns are formed. The post guide patterns are patterns where the post guides G are arranged and are used for controlling the arrangement of dots 23a of self-assembling materials 23 in a later process. In view of forming a pattern of the doughnut-shaped magnetic disk 10, it is preferable that the electron beam drawing machine EBM has a moving mechanism which moves a stage in one horizontal direction and a rotating mechanism which rotates the stage.

When the self-assembling materials 23 are used, guide grooves and post patterns for controlling their arrangement can also be formed in this electron beam drawing process. After the electron beam drawing, the resist 12 is developed by a developing solution, and a resist pattern 12a serving as a resist master is formed (refer to FIG. 2C).

Incidentally, the development of the resist 12 may be preceded by a post-baking process, and the resist 12 may be treated with a rinse solution after being developed.

Here, in the above-described manufacturing processes, a case where the positive resist is used is described, but a negative resist may be used. In this case, electron beam radiated portions and electron beam non-radiated portions are exchanged and the pattern is reversed in a later process.

A shape of the substrate 11 is not particularly limited, but the substrate 11 is preferably a disk-shaped one, for example, a silicon wafer or the like. Here, the disk may have notches or orientation flats. As the substrate 11, a glass substrate, a quartz substrate, an Al-based alloy substrate, a ceramic substrate, a carbon substrate, a compound semiconductor substrate, or the like is usable. As the glass substrate, amorphous glass or crystallized glass is usable. The amorphous glass includes soda lime glass, aluminosilicate glass, and the like. Examples of the crystallized glass are lithium-based crystallized glass and the like. As the ceramic substrate, a sintered compact mainly composed of aluminum oxide, aluminum nitride, silicon nitride, or the like or one obtained through fiber reinforcement of any of these sintered compacts is usable. As the compound semiconductor substrate, GaAs, AlGaAs, or the like is usable.

Incidentally, a plurality of films where to transfer the pattern may be formed on the substrate 11.

(2) Formation of Guide Pattern Master 11a

Next, the substrate 11 is etched with the resist pattern 12a as the resist master used as a mask, whereby a guide pattern master 11a is formed. Thereafter, a residue of the resist pattern 12a used as the etching mask is removed by oxygen RIE (Reactive Ion Etching) or the like.

In the case where the plural films are formed on the substrate 11, there may be included a process of transferring the resist pattern 12a onto these films.

Figure 2D:
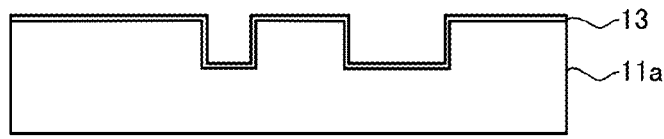
FIG. 2D is a view illustrating a manufacturing process of the magnetic recording medium.
Figure 2E:
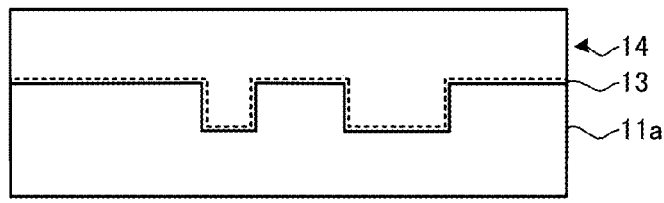
FIG. 2E is a view illustrating a manufacturing process of the magnetic recording medium.

(3) Formation of Father Stamper 14 (Refer to FIG. 2D to FIG. 2E)

A Ni conductive layer 13 is formed on the guide pattern master 11a by sputtering (refer to FIG. 2D). The father stamper 14 of Ni whose convexity and concavity are reversed from those of the guide pattern master 11a is formed on the conductive layer 13 by Ni electroforming (refer to FIG. 2E). Note that the conductive layer 13 becomes part of the father stamper 14.

Figure 2F:
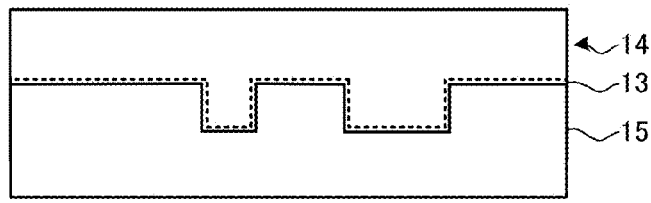
FIG. 2F is a view illustrating a manufacturing process of the magnetic recording medium.

(4) Formation of Father Stamper 15 (Refer to FIG. 2F)

Subsequently, after the guide pattern master 11a is exfoliated from the father stamper 14, the father stamper 14 is reproduced by electroforming. As a result, the father stamper 15 of Ni having the same convexity and concavity as those of the guide pattern master 11a is obtained (refer to FIG. 2F).

Figure 3A:
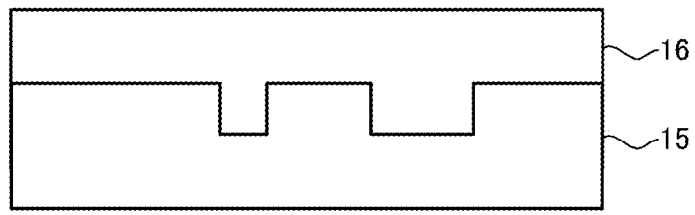
FIG. 3A is a view illustrating a manufacturing process of the magnetic recording medium.

(5) Formation of Resin Stamper 16 (Refer to FIG. 3A)

Next, after the father stamper 14 is exfoliated from the father stamper 15, the resin stamper 16 is formed by injection molding using the father stamper 15 (refer to FIG. 3A).

Figure 3B:
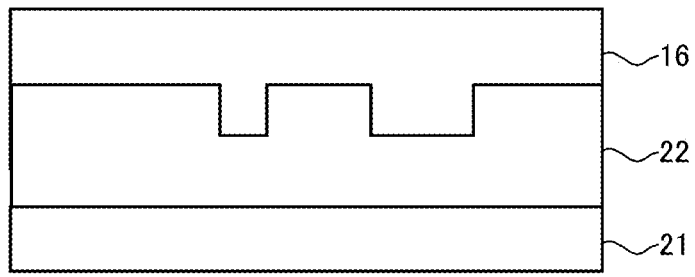
FIG. 3B is a view illustrating a manufacturing process of the magnetic recording medium.
Figure 3C:
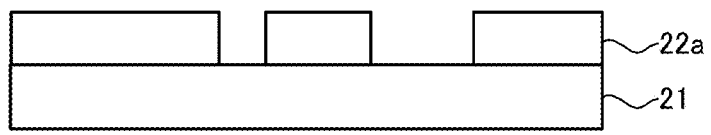
FIG. 3C is a view illustrating a manufacturing process of the magnetic recording medium.

(6) Formation of Photopolymer Pattern 22a (Refer to FIG. 3B to FIG. 3C)

Next, a Si substrate 21 on whose upper surface a photopolymer material layer 22 is applied is prepared. After the father stamper 15 is exfoliated from the resin stamper 16, UV (Ultra Violet) imprinting is applied on the photopolymer material layer 22 by using the resin stamper 16 (refer to FIG. 3B). A photopolymer material remaining on the Si substrate 21 at portions pressed by the imprinting is subjected to oxygen RIE, whereby a surface of the Si substrate 21 is exposed. Consequently, a photopolymer pattern 22a is obtained (refer to FIG. 3C).

Figure 3D:
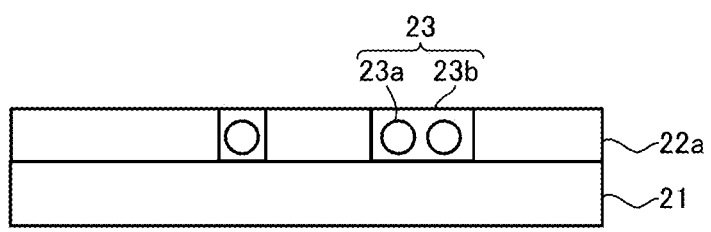
FIG. 3D is a view illustrating a manufacturing process of the magnetic recording medium.
Figure 3E:
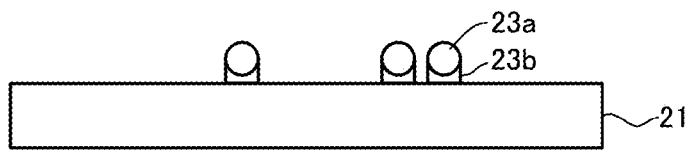
FIG. 3E is a view illustrating a manufacturing process of the magnetic recording medium.

(7) Formation of Dots 23a (Refer to FIG. 3D to FIG. 3E)

Subsequently, in concave portions of the photopolymer pattern 22a, the self-assembling materials 23 (for example, diblock copolymer solution such as PS-PDMS (polystyrene-polydimethylsiloxane)) are applied, followed by annealing. The self-assembling material 23 can be classified into a first component (for example, PDMS) self-assembled in a spherical form or a cylindrical form and a second component (PS) surrounding the first component. Therefore, as a result of the annealing, dots 23a of the first component (a first phase) and coverings 23b of the second component (a second phase) surrounding the dots 23a are formed.

Here, as the first component, used is one lower in etching rate than the second component and the photopolymer pattern 22a. As a result of the oxygen RIE, the dots 23a are left due to the difference in the etching rate (FIG. 3E).

Figure 3F:
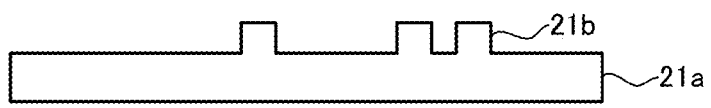
FIG. 3F is a view illustrating a manufacturing process of the magnetic recording medium.

(8) Formation of Si Master Mold 21a (Refer to FIG. 3F)

Thereafter, the Si substrate 21 is subjected to RIE using $CF_4$ or oxygen with the dots 23a (the first phase) used as a mask. Thereafter, the dots 23a (the first phase) are removed, whereby the Si substrate 21 becomes a Si master mold 21a having projections 21b (FIG. 3F).

Incidentally, a plurality of films with an appropriate etching rate where to transfer the pattern may be formed on the surface of the Si substrate 21. In this case, a process of transferring the pattern to these films based on the self-assembled dots 23a is executed.

Figure 4A:
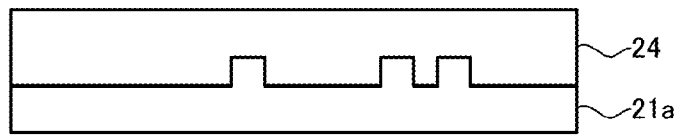
FIG. 4A is a view illustrating a manufacturing process of the magnetic recording medium.
Figure 4B:
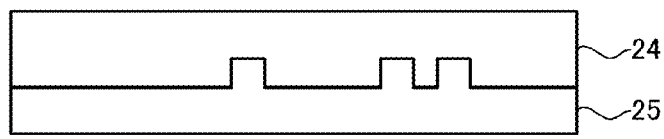
FIG. 4B is a view illustrating a manufacturing process of the magnetic recording medium.
Figure 4C:
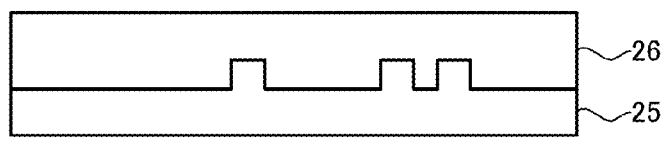
FIG. 4C is a view illustrating a manufacturing process of the magnetic recording medium.

(9) Formation of Resin Stamper 26 (Refer to FIG. 4A to FIG. 4C)

Next, a conductive film is formed on a surface of the Si master mold 21a and a father stamper 24 of Ni is formed by Ni electroforming (FIG. 4A). Subsequently, after the Si master mold 21a is exfoliated from the father stamper 24, the father stamper 24 is reproduced by electroforming, whereby a mother stamper 25 of Ni is obtained (FIG. 4B).

Next, a resin stamper 26 is formed by injection-molding using the mother stamper 25 (FIG. 4C).

Figure 4D:
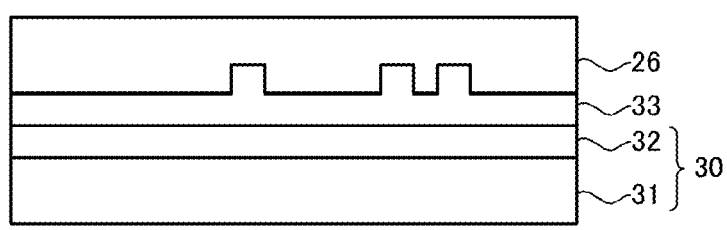
FIG. 4D is a view illustrating a manufacturing process of the magnetic recording medium.
Figure 4E:
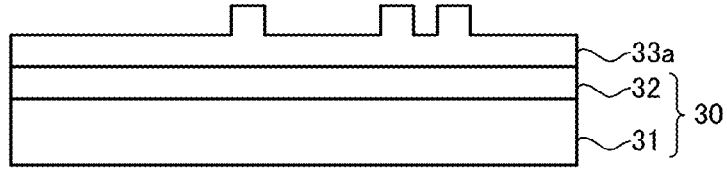
FIG. 4E is a view illustrating a manufacturing process of the magnetic recording medium.
Figure 4F:
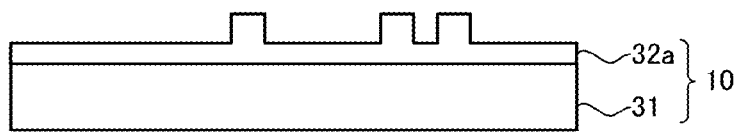
FIG. 4F is a view illustrating a manufacturing process of the magnetic recording medium.

(10) Formation of Magnetic Disk 10 (Refer to FIG. 4D to FIG. 4F)

Next, a magnetic disk substrate 30 in which a magnetic layer 32 is formed on an upper surface of a substrate 31 is prepared and a photopolymer material 33 is applied on the magnetic layer 32. Then, by using the resin stamper 26, the photopolymer material 33 is subjected to UV imprinting, whereby a photopolymer pattern 33a is formed (FIG. 4D).

Subsequently, after the resin stamper 26 is exfoliated, the magnetic layer 32 is ion-milled with the formed photopolymer pattern 33a used as a mask. Consequently, the magnetic disk 10 in which a magnetic pattern 32a is formed on the substrate 31 is obtained (FIG. 4E, FIG. 4F).

Incidentally, a protective film may be applied on the formed magnetic pattern 32a, and a process of filling concave portions such as grooves with a nonmagnetic material may be included.

(Relation of Post Guides and Arrangement Mode)

Next, a relation of a pitch Pg of the post guides G, a pitch Pd of the self-assembled dots D, and an arrangement mode will be described.

Figure 5:
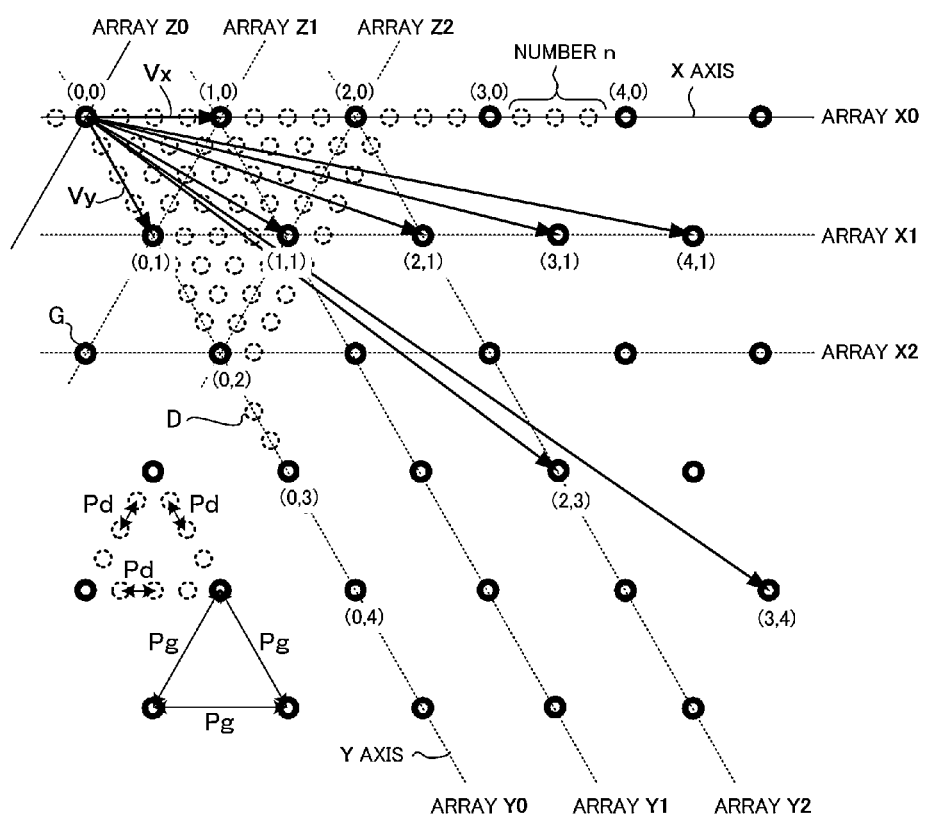
FIG. 5 is a view illustrating the disposition of post guides.

FIG. 5 is a view illustrating the disposition of the post guides G on the stamper. As previously described, the post guides G are disposed in a hexagonal crystal form. That is, the post guides G are disposed at corners of substantially equilateral triangles placed all over a plane. That is, the post guides G are cyclically arranged in X, Y, and Z axis directions which are along directions of respective sides of the triangle. The X, Y, and Z axes are set to mutually make a substantially 120° (60°) angle. A length of the side of the equilateral triangle is the shortest distance between the post guides G, that is, the pitch Pg of the post guides G.

The X and Y axis directions correspond respectively to mutually different first direction and second direction on the main surface of the stamper. Further, distances between the post guides G in the X and Y axis directions are the pitch Pg and are substantially equal to each other.

Note that some degree of error is allowed for an angular relation of the X, Y, and Z axes. Specifically, an angle made by the X and Y axes is in a range of 120°±10° (60°±10°) (more preferably, 120°±5° (60°±5°)). Further, an error of about ±5° is allowed for the distance between the post guides G in each of the X and Y axis directions.

Here, positions of the post guides G can be expressed by coordinates (x, y) in the X and Y axis directions owing to the cyclic characteristic of their arrangement (a coordinate in the Z axis direction is not necessary). With a given post guide G being defined as an origin (0, 0), the position of the other post guide G can be expressed by coordinates (nx, ny). Here, nx and ny correspond to quantities (numbers) of the post guides G from the origin (0, 0) in the X and Y axis directions respectively. The post guides G are two-dimensionally arranged in arrays X0, X1 ... Xnx ..., arrays Y0, Y1 ... Yny ... (arrays Z0, Z2 ... Znz ...) in the X and Y axis directions (Z axis direction). A point of intersection of the arrays Xnx and Yny corresponds to the coordinates (nx, ny).

A direction from the origin (0, 0) on the stamper can also be expressed as a direction (nx, ny) by using the coordinates. Hereinafter, the direction on the stamper will be expressed by using such an expression. In FIG. 5, directions (0, 1) to (4, 1), (2, 3), (3, 4), and the like are shown. At this time, the direction (nx, ny) is expressed as the following expression (1) by using unit vectors Vx, Vy in the X and Y axis directions (vectors corresponding to the pitch Pg in the X and Y axis directions).

$$\text{direction } (nx, ny) = nx*Vx + ny*Vy \qquad \text{expression (1)}$$

The self-assembled dots D are disposed with the post guides G serving as the references. Concretely, between the post guides G, n pieces of the self-assembled dots D are disposed. In FIG. 5, between the post guides G in each of the arrays X0, X1 ... Xnx ... and the arrays Y0, Y1 ... Yny ..., three pieces of the self-assembled dots D are disposed.

In order to ensure stability of the arrangement of the self-assembled dots D, it is desirable that the pitch Pg of the post guides G is an integer m (m=n+1, n: the number of the self-assembled dots D between the post guides G) times of the pitch Pd of the self-assembled dots D (a pitch ratio R (=Pg/Pd) is an integer). The self-assembled dots D themselves have the pitch Pd with which they can be cyclically arranged, and therefore, if the pitch Pd and the pitch Pg of the post guides G are not consistent with each other, the arrangement of the self-assembled dots D becomes unstable, and it is difficult to cyclically arrange the self-assembled dots D over a wide range.

What matter here are density and accuracy of the arrangement of the post guides G.

The density of the arrangement of the post guides G will be described. Specifically, the pitch ratio R is preferably larger because the post guides G are created more easily. However, when the pitch ratio R is too large, stability of the arrangement of the self-assembled dots D deteriorates. For example, when the post guides G are disposed with a pitch several ten times as large as the pitch Pd of the self-assembled dots D, different arrangement modes occur.

Therefore, in order to completely control the arrangement over a wide area, the pitch ratio R is preferably as small as possible. Concretely, the pitch ratio R is set to 2 and the post guides G are disposed at a cycle twice as large as the pitch Pd of the self-assembled dots D.

However, in order to record information with high density, the pitch Pd of the self-assembled dots D needs to be small, and therefore, the pitch Pg of the post guides G also needs to be small. The post guides G are formed by using the electron beam drawing machine, and if their pitch is 50 nm or less, it is difficult to accurately draw them due to a proximity effect.

As described above, there is a limit to increasing the density of the arrangement of the post guides G (decreasing the pitch Pg), and it is not easy to arrange the self-assembled dots D with high density. There is an appropriate value for the pitch ratio R, and it will be discussed later that this value is not always an integer.

Accuracy of the arrangement of the post guides G will be described. In the BPM, a deviation of the pitch Pd of the self-assembled dots D needs to be reduced.

At present, a limit of positional accuracy of an electron beam drawing machine is 1 nm to 2 nm. For example, if the pitch Pd of the self-assembled dots D is 20 nm, this positional accuracy corresponds to 5% to 10%. In the BPM, the positional error needs to be 5% or less. Therefore, in a higher-density information recording medium, the positional error of the post guides G is more problematic.

As described above, it is not easy to control the dot arrangement over a wide area without greatly increasing the accuracy and density of the post guides G.

For example, it can be thought that due to the positional error of the post guides G, a distance between the post guides G becomes an integral multiple of the pitch Pd of the self-assembled dots not in the direction (1, 0) but in the direction (2, 1) (between the directions (1, 0), (1, 1)). In this case, the self-assembled dots D are highly possibly arranged in the direction (2, 1). The same applies to the direction (1, 2) and so on. Thus, there is a possibility that the self-assembled dots D are arranged in a direction different from an originally intended direction due to the positional error of the post guides G.

Here, a difference in positional error E of the post guides G among the arrangement directions of the self-assembled dots D will be studied. The positional error E of the post guides G indicates an aligned state (alignment deviation) of the self-assembled dots D, and it is thought that the self-assembled dots D are arranged in a direction where the positional error E is the smallest. In order to stably arrange the self-assembled dots D, it is thought to be preferable that the positional error E in this direction is sufficiently smaller than the positional error E in the other directions. That is, in a case where a state with a small positional error E exists in different directions, there is a possibility that the self-assembled dots D are arranged in both of these directions. Hereinafter, this will be concretely described.

The positional error E[%] of the post guides G can be calculated by using the following expression (2).

$$E = [(L)nx, ny] \bmod pd)/Pd] * 100 \qquad \text{expression (2)}$$

L(nx, ny): distance between the post guides G in a direction (nx, ny)

pd: pitch of the self-assembled dots D

A mod B: the minimum value of a difference between an integral multiple of the value B and the value A For example, when A=5.1 and B=1, "A mod B" is 5.1−1*5=0.1. Further, when A=5.8 and B=1, "A mod B" is |5.8−1*6|=0.2. That is, "A mod B" is a smaller value of a remainder R of the division of the value A by the value B and an absolute value (|R−B|) of a value equal to the remainder R from which the value B is further subtracted.

Figure 6:
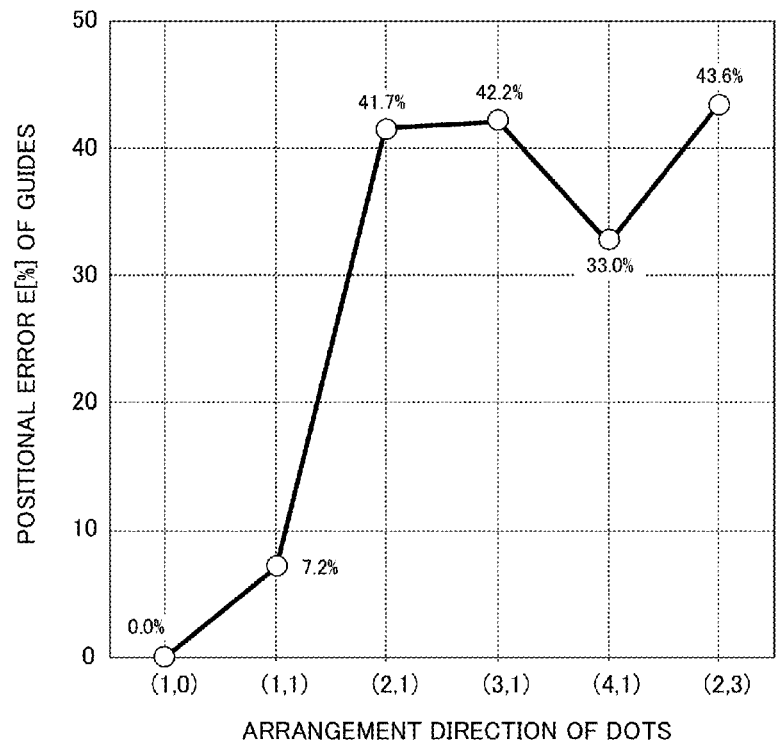
FIG. 6 is a chart representing a relation between an arrangement direction of self-assembled dots and a deviation of the post guides.
Figure 7:
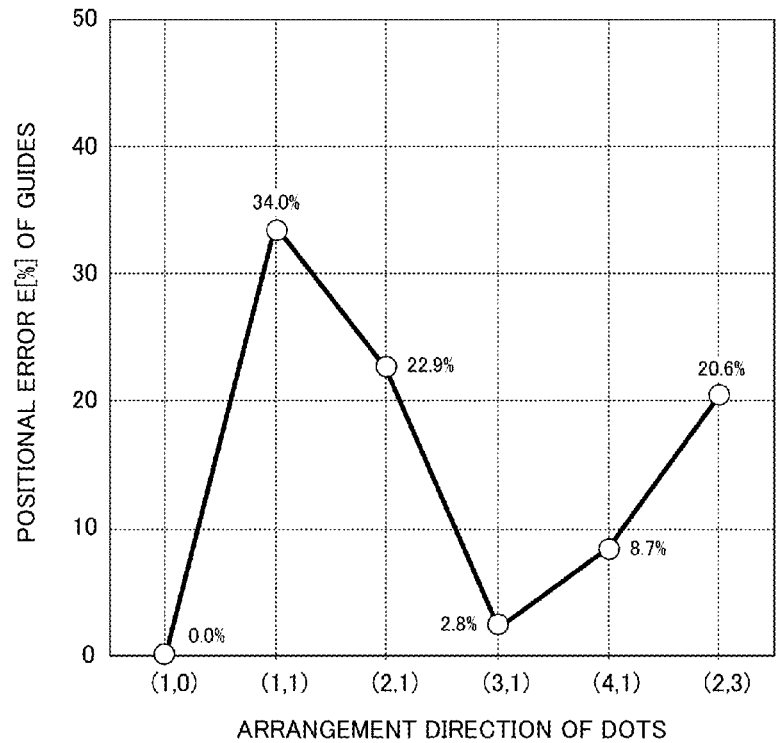
FIG. 7 is a chart representing a relation between the arrangement direction of the self-assembled dots and a deviation of the post guides.

FIG. 6 and FIG. 7 represent calculation results of the positional error E[%] of the post guides G in directions (1, 0), (1, 1), (2, 1), (3, 1), (4, 1), and (2, 3). Here, the pitch Pd of the self-assembled dots D is set to 20 nm. FIG. 6 and FIG. 7 represent the positional error E when the pitch Pg of the post guides G is four times (80 nm) as large as the pitch Pd (the pitch ratio R is 4) and when the pitch Pg is five times (100 nm) as large as the pitch Pd (the pitch ratio R is 5), respectively.

As represented in FIG. 6, when the pitch ratio R is 4, the positional error E[%] is small in the direction (1, 1) besides the direction (1, 0). However, a value of the positional error E in the direction (1, 1) is 7%, which is relatively large.

As represented in FIG. 7, when the pitch ratio R is 5, the positional error E[%] is small in the direction (3, 1) besides the direction (1, 0). A value of the positional error E in the direction (3, 1) is 2.8%, which is relatively small. That is, in this case, there is a relatively high possibility that a (1, 0) arrangement and a (3, 1) arrangement occur due to the error of the pitch Pg of the post guides G.

Figure 8:
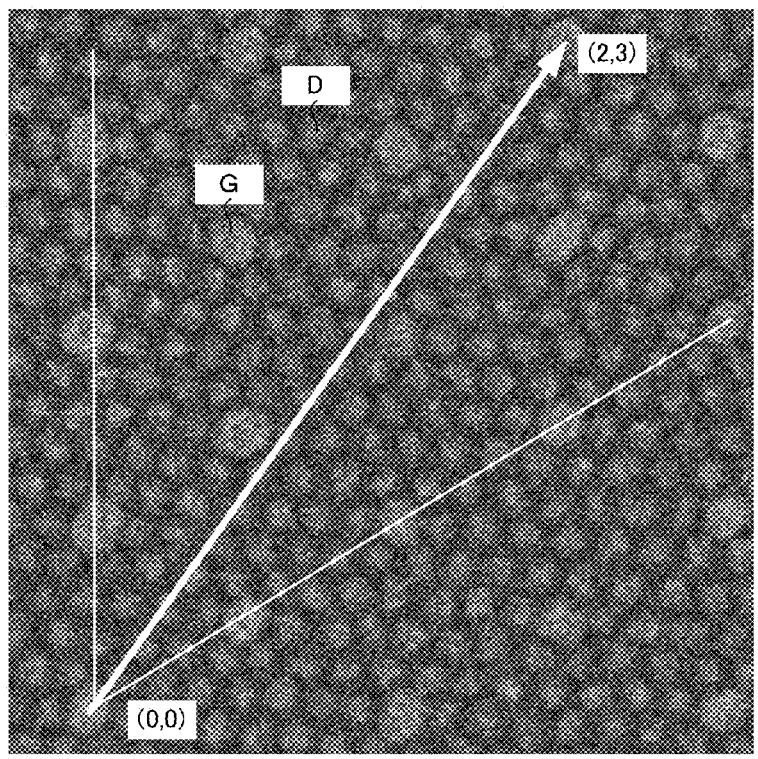
FIG. 8 is a SEM photograph illustrating an arrangement state of the self-assembled dots.
Figure 9:
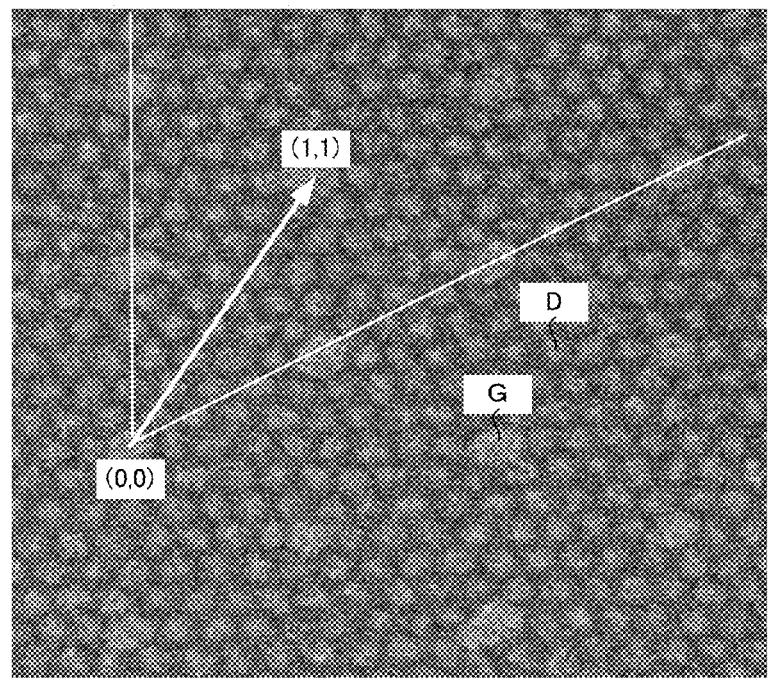
FIG. 9 is a SEM photograph illustrating an arrangement state of the self-assembled dots.
Figure 10:
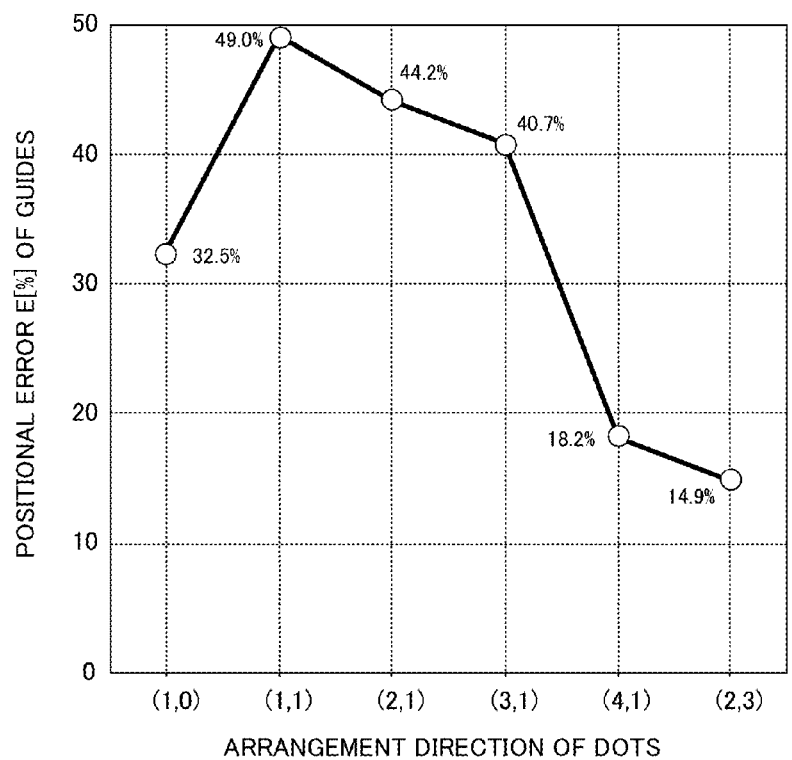
FIG. 10 is a chart representing a relation between the arrangement direction of the self-assembled dots and a positional error of the post guides.
Figure 11:
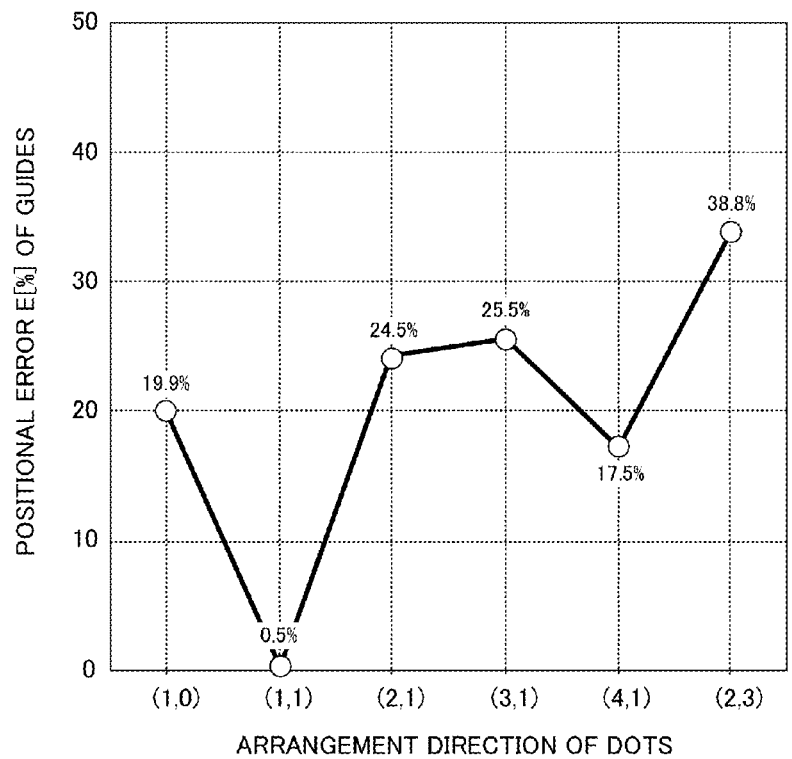
FIG. 11 is a chart representing a relation between the arrangement direction of the self-assembled dots and a positional error of the post guides.

FIG. 8 and FIG. 9 are electron microscope observation images (=SEM) of a stamper in which the self-assembled dots D are arranged by using the post guides G. FIG. 10 and FIG. 11 correspond to FIG. 8 and FIG. 9 respectively and are graphs each representing a relation between the arrangement direction of the self-assembled dots D and the positional error E. In FIG. 8 and FIG. 10, the self-assembled dots D are arranged in the direction (2, 3) where the positional error E is the smallest. In FIG. 9 and FIG. 11, the self-assembled dots D are arranged in the direction (1, 1) where the positional error E is the smallest.

It is understood that the self-assembled dots D are thus arranged in the direction where the positional error E is the smallest.

Here, it will be discussed that selecting a unique pitch ratio R enables the stable arrangement of the self-assembled dots D. That is, in this case, even when an error occurs in the pitch Pg of the post guides G, the arrangement in a single arrangement mode over a wide area is facilitated.

Table 1 shows appropriate values of a ratio of the pitch Pg of the post guides G to the pitch Pd of the self-assembled dots D (appropriate pitch ratio Rp (=Pg/Pd)). This table is prepared based on the calculation results, represented in FIG. 6 and FIG. 7, of the positional error E[%] of the post guides G in the directions (1, 0) and so on at the specific pitch ratios R.

TABLE 1

| Guides | Dots | |
|---|---|---|
| Appropriate pitch ratio Rp | Arrangement direction | Number of sections m |
| 2.0 | (1.0) | 2 |
| 2.7 | (1.1) | 3 |
| 3.8 | (1.1) | 4 |
| 4.0 | (1.0) | 4 |
| 4.6 | (1.1) | 5 |
| 5.2 | (1.1) | 6 |
| 5.8 | (1.1) | 7 |
| 6.8 | (1.1) | 8 |
| 7.0 | (1.0) | 7 |
| 9.0 | (1.0) | 9 |
| 13.0 | (1.0) | 13 |

Table 1 shows the appropriate pitch ratio Rp, an arrangement direction of the self-assembled dots D at this time, and the number m of sections. The appropriate pitch ratio Rp is a pitch ratio R (=Pg/Pd) enabling the stable arrangement of the self-assembled dots D. The number m of sections is a value obtained by dividing the distance L(nx, ny) between the post guides G in the arrangement direction (nx, ny) of the self-assembled dots D by the pitch Pd of the self-assembled dots D (m=L(nx, ny)/Pd). In the arrangement direction of the self-assembled dots D, the number m of sections is preferably an integer.

As shown in Table 1, for the appropriate pitch ratio Rp, the arrangement direction of the self-assembled dots D is the direction (1, 0) or (1, 1). In other words, as the arrangement direction of the self-assembled dots D, the direction (1, 1) can be adopted in addition to the direction (1, 0).

Preferably, the positional error E in this arrangement direction is sufficiently small as compared with the positional error E in the other directions. For example, it is preferable that the positional error E in the arrangement direction is 5% or less and the positional error E in the other directions is over 15%.

That "the positional error E in the arrangement direction is 5% or less" means that there is some integer $m_1$ with which the distance L between the post guides G in the arrangement direction is in a range of the integer $m_1$ ±0.05 times of the average pitch Pd of the self-assembled dots D.

That "the positional error E in the arrangement direction is over 15%" means that there does not exist an integer $m_2$ with which the distance L between the post guides G in the arrangement direction falls within a range of the integer $m_2$ ±0.15 times of the average pitch Pd of the self-assembled dots D. In this case, with any integer $m_2$, the distance L between the post guides G in the arrangement direction falls out of the range of the integer $m_2$ ±0.15 times of the average pitch Pd of the self-assembled dots D.

The appropriate pitch ratio Rp in the arrangement direction (1, 0) includes 2.0, 7.0, 9.0 and 13.0. In other words, when the pitch ratio R (the number m of sections) is 3 to 6, 8, or 10 to 12, there exist a plurality of directions where the positional error E is small, and it is difficult to ensure stability of the arrangement of the self-assembled dots D.

The appropriate pitch ratio Rp in the arrangement direction (1, 1) includes 2.7, 3.8, 4.6, 5.2, 5.8, and 6.8 (the number m of sections=3 to 8). That is, the appropriate pitch ratio Rp in the arrangement direction (1, 1) is not an integer.

Here, it will be described that the stable arrangement is possible in the directions (1, 0), (1, 1), in other words, the stable arrangement in the other directions is difficult.

Figure 12:
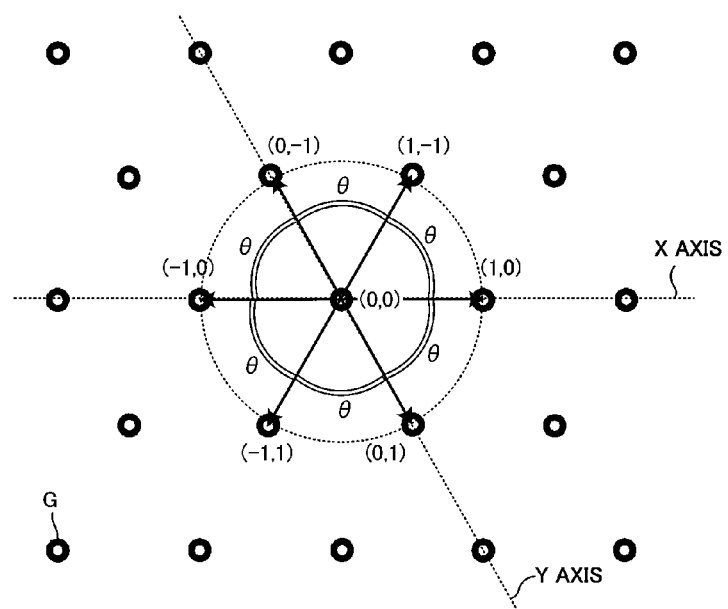
FIG. 12 is a view illustrating a distance relation of the post guides in a direction (1, 0).
Figure 13:
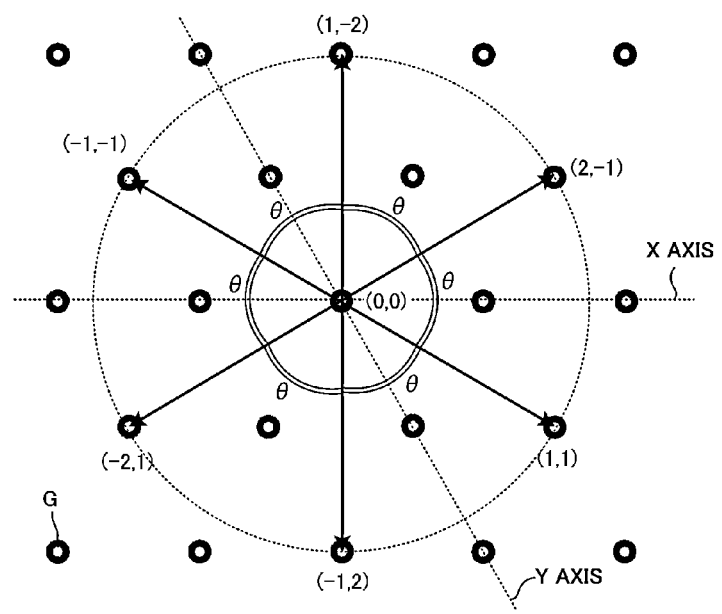
FIG. 13 is a view illustrating a distance relation of the post guides in a direction (1, 1).
Figure 14:
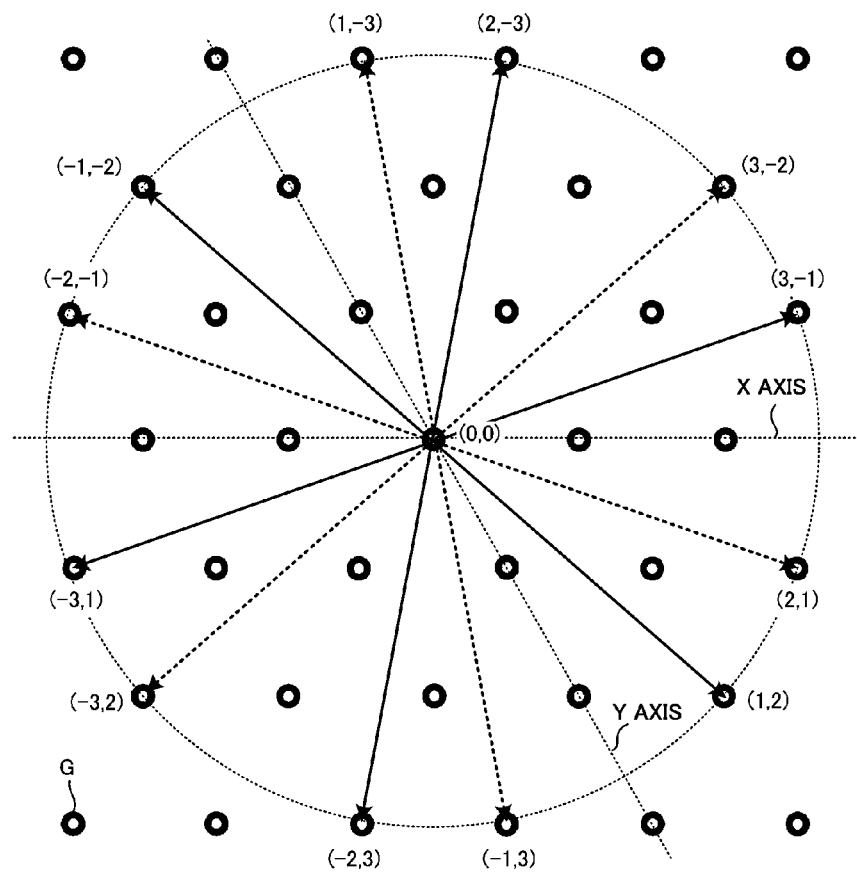
FIG. 14 is a view illustrating a distance relation of the post guides in a direction (2, 1).

FIG. 12 to FIG. 14 are views illustrating distance relations of the post guides G in the directions (1, 0), (1, 1), (2, 1) respectively.

As illustrated in FIG. 12, distance and direction in the direction (1, 0) can be expressed by a vector connecting an origin (0, 0) and coordinates (1, 0). Then, a distance equal to this distance can also be realized in directions (1, −1), (0, −1), (−1, 0), (−1, 1), (0, 1). Here, these directions mutually make an angle θ (=60°), which corresponds to regularity of the arrangement of the self-assembled dots D, and therefore, the arrangement of the self-assembled dots D in these directions (1, 0) and so on is possible.

As illustrated in FIG. 13, distance and direction in the direction (1, 1) can be expressed by a vector connecting the origin (0, 0) and coordinates (1, 1). Then, a distance equal to this distance can also be realized in directions (2, −1), (1, −2), (−1, −1), (−2, 1), (−1, 2). Here, these directions mutually make an angle θ (=60°), which corresponds to regularity of the arrangement of the self-assembled dots D, and therefore, the arrangement of the self-assembled dots D is possible in these directions (1, 1) and so on.

As described above, in the directions (1, 0), (1, 1), the arrangement of the self-assembled dots D is possible because the directions corresponding to these directions mutually make the angle θ (=60°).

As illustrated in FIG. 14, distance and direction in the direction (2, 1) can be expressed by a vector connecting the origin (0, 0) and coordinates (2, 1). Then, a distance equal to this distance can also be realized in directions (3, −1), (3, −2), (2, −3), (1, −3), (−1, −2), (−2, −1), (−3, 1), (−3, 2), (−2, 3), (−1, 3), (1, 2).

Here, in the directions (2, 1), (3, −2), (1, −3), (−2, −1), (−3, 2), (−1, 3) (referred to as the directions (2, 1) etc.) and in the directions (1, 2), (3, −1), (2, −3), (−1, −2), (−3, 1), (−2, 3) (referred to as the directions (1, 2) etc.), the arrangement of the self-assembled dots D is possible because these directions mutually make an angle θ (=60°).

However, it is difficult to ensure stability of the arrangement of the self-assembled dots D in the directions (2, 1) etc. and the directions (1, 2) etc. because the former and the latter do not mutually make the angle θ (=60°) (and an integral multiple thereof). That is, there exist two arrangement modes 1, 2 corresponding to the directions (2, 1) etc. and the directions (1, 2) etc. respectively. Therefore, when the self-assembled dots D are arranged in an area that is large to a certain degree, a plurality of domains corresponding to the arrangement modes 1, 2 respectively exist in mixture, and especially in boundaries of the domains, the self-assembled dots D are arranged disorderly.

Here, the case of the direction (2, 1) is illustrated, but the same applies to the other cases. Specifically, in the direction (nx, ny), when absolute values of nx and ny are different integers equal to 1 or more, there exist a plurality of arrangement modes, and it is difficult to ensure stability of the arrangement of the self-assembled dots D. This is because, in the direction (nx, ny) and a direction (ny, nx) where nx and ny are exchanged, the distance between the post guides G is the same, but an angle mutually made by them is smaller than θ (=60°).

The following is the summary of the above.

For the stability of the arrangement of the self-assembled dots in the direction (1, 0), it is necessary for the pitch ratio of the post guides G and the self-assembled dots to be a specific value 2, 4, 7, 9, 13, or the like (±0.05) (refer to Table 1).

Note that the direction (1, 0) is equivalent to the directions (0, 1), (1, −1) and so on (refer to FIG. 12).

(2) The stable arrangement of the self-assembled dots D is possible also in the direction (1, 1). In this case, it is necessary for the pitch ratio of the post guides G and the self-assembled dots D to be a specific value 2.7 or the like (±0.05) (refer to Table 1).

Note that the direction (1, 1) is equivalent to the directions (2, −1), (1, −2) and so on (refer to FIG. 13).

(3) In directions except the directions (1, 0), (1, 1) and the directions equivalent to these, the stable arrangement of the self-assembled dots D is difficult. In this case, there is a high possibility that a plurality of arrangement modes exist in mixture.

(Description by Unit Lattice)

In the embodiment described above, the arrangement of the post guides G and the self-assembled dots D has a cyclic characteristic. Therefore, it is possible to describe the arrangement of the post guides G and the self-assembled dots D by a unit lattice in which the post guide G serves as a unit, as will be described later.

(1) Notation of Position

Figure 15:
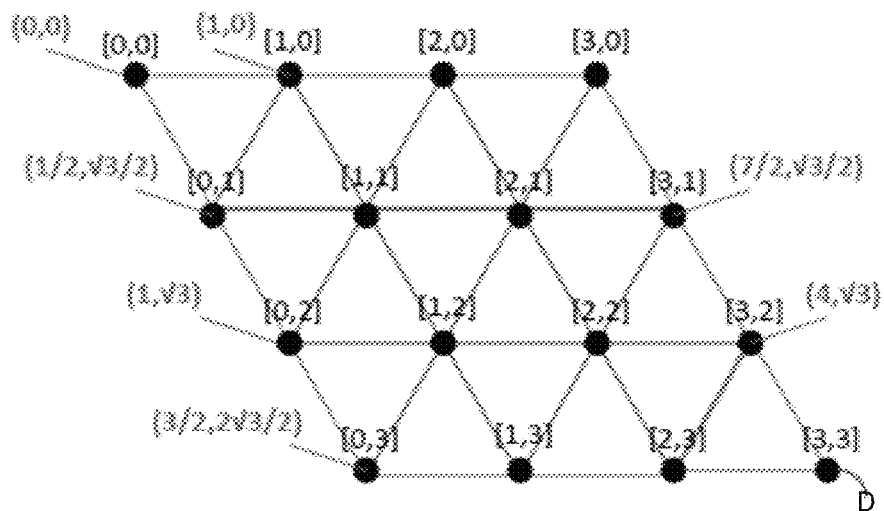
FIG. 15 is a schematic view illustrating the arrangement of the self-assembled dots.

FIG. 15 is a schematic view illustrating the arrangement of the self-assembled dots D. Here, to facilitate the later description, the notation (position [n, m], position (x, y)) of the arrangement in FIG. 15 is different from that in FIG. 5.

The position [n, m] and the position (x, y) each represent the position of the self-assembled dot D. The position [n, m] represents the position of the self-assembled dot D by an integer n that increases as the position goes in a rightward direction and an integer m that increases as the position goes in a right downward direction, with a left upward position being an origin. The position (x, y) represents the position of the self-assembled dot D by the X-Y coordinates based on the X axis and the Y axis orthogonal to each other, with a left upward position serving as the origin.

Here, the distance between the self-assembled dots D is set to 1. For example, a position [3, 2] represents a position apart rightward by three and apart right downward by two from the origin. The position at this time is expressed by coordinates $(4, \sqrt{3})$.

(2) Basic Unit Lattice UL0

Figure 16:
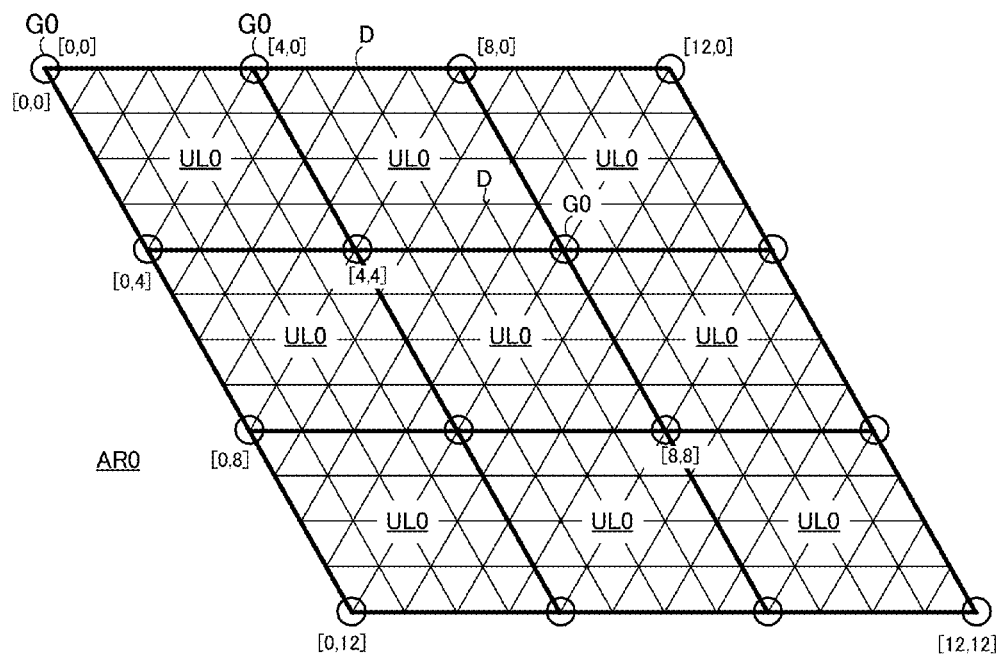
FIG. 16 is a schematic view illustrating an example of the arrangement of post guides and self-assembled dots.

FIG. 16 illustrates an arrangement AR0 of post guides G0 and self-assembled dots D. The post guides G0 are disposed at positions of intervals 4 (positions [4*i, 4*j], i, j: integer) in two longitudinal and lateral directions, and the self-assembled dots D are disposed at the other positions [n, m]. Specifically, lattice points of a parallelogram represent the positions where the self-assembled dots D are disposed. The circular marks represent the positions of the post guides G0. The arrangement AR0 illustrated in FIG. 16 is the same as the arrangement illustrated in FIG. 5. However, in FIG. 16, the notation of the positions corresponds to that in FIG. 15.

Figure 17:
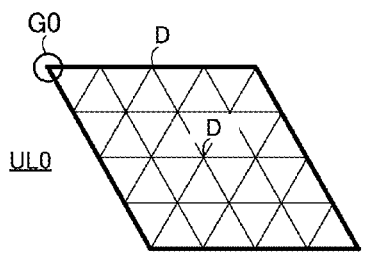
FIG. 17 is a schematic view illustrating an example of a basic unit lattice.

FIG. 17 is a basic unit lattice UL0 being a unit expressing the arrangement AR0. The post guide G0 is disposed at the origin [0, 0], and the self-assembled dots D are disposed at the other positions [n, m]. The basic unit lattices UL0 are arranged longitudinally and laterally as illustrated in FIG. 16, whereby the arrangement AR0 can be formed.

As described above, by reflecting the cyclic characteristic of the post guides G0 and using the basic unit lattices UL0, it is possible to describe the arrangement AR0 of the post guides G0 and the self-assembled dots D.

Here, the parallelogramic unit lattice defined by the origin [0, 0] and the position [4, 4] is defined as the basic unit lattice UL0. In general terms, a parallelogramic unit lattice defined by the origin [0, 0] and a position [n, m] (n, m: integer) may be defined as the basic unit lattice.

At this time, as the integers n, m, 3 or more is usually selected. When the integers n, m are 2, there is no space where to dispose the self-assembled dots D between the origin [0, 0] and the position [n, m]. On the other hand, it is not preferable that the integers n, m are, for example, 10 or more. In this case, nine pieces of the self-assembled dots D or more are disposed between the origin [0, 0] and the position [n, m] where the post guides G are disposed, and there is a possibility that stability of the arrangement of the self-assembled dots deteriorates at the time of the self-assembly (a possibility that a plurality of arrangements of the self-assembled dots D exist in mixture).

(Modification of Basic Unit Lattice UL0)

Hereinafter, improving the arrangement of the self-assembled dots D by modifying the basic unit lattice UL0 will be considered.

(1) Addition of One Post Guide G1 to Basic Unit Lattice UL0

Adding a post guide G to the basic unit lattice UL0 will be considered. It is thought that adding the post guide G can improve stability of the arrangement of the self-assembled dots D.

Figure 18:
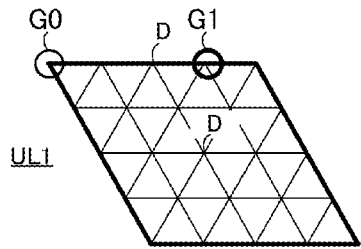
FIG. 18 is a schematic view illustrating an example of a unit lattice.
Figure 19:
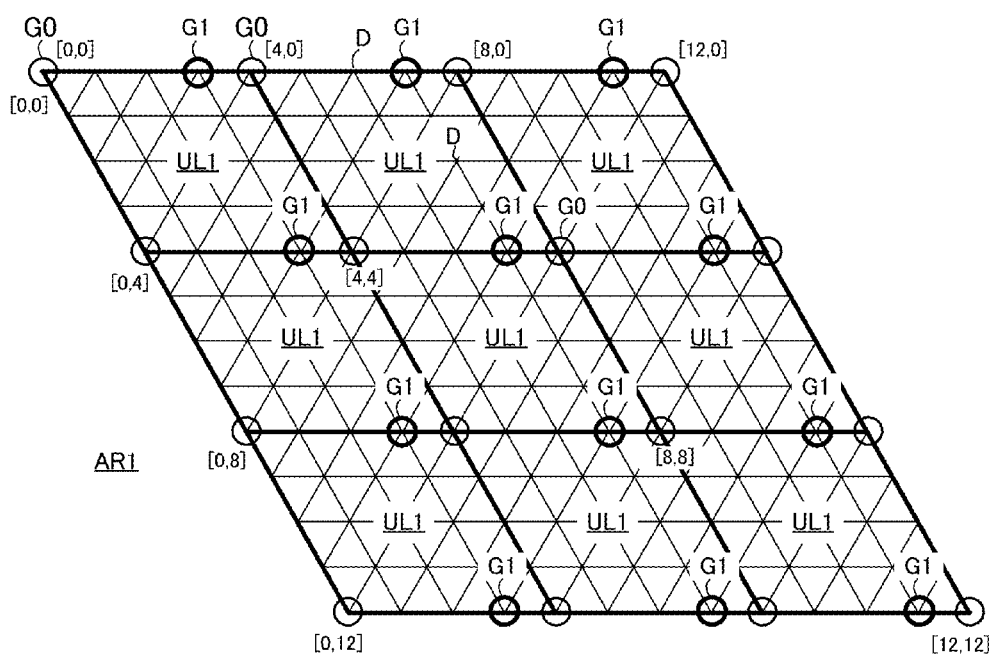
FIG. 19 is a schematic view illustrating an arrangement expressed by the unit lattice.

FIG. 18 and FIG. 19 illustrate a unit lattice UL1 and an arrangement AR1 expressed by the arrangement of the unit lattices UL1. The unit lattice UL1 is the basic unit lattice UL0 to which a post guide G1 at a position [3, 0] is added. Thus adding the post guide G1 can improve stability of the arrangement of the self-assembled dots D.

(2) Study on Correspondence Relation Between Position and Distance of Post Guide G Further, adding two post guides G1, G2 or more to the basic unit lattice UL0 will be considered. Prior to this, a correspondence relation between the position and distance of the post guide G will be studied.

The post guides G are disposed so as to correspond to a desired arrangement AR01 of the self-assembled dots D. At this time, there is a possibility that the post guides G are disposed at positions also corresponding to an arrangement AR02 not assumed from the arrangement AR1 (for example, an arrangement 30-degree rotated from the arrangement AR01). In this case, a formed arrangement AR03 has a state where two kinds of the arrangements AR01, AR02 are mixed, that is, a multi-domain structure.

Here, if distances of positions [n, m], [n', m'] of the two added post guides G from the origin [0, 0] are short, the multi-domain structure is likely to occur. For example, the distances of the position [2, 1] and the position [1, 2] from the origin are both 2.6458. Therefore, the post guide G disposed at the position [2, 1] becomes the post guide G for both the arrangement of the self-assembled dots in FIG. 15 and the arrangement resulting from its rotation. Therefore, there is a possibility that the multi-domain structure where these two arrangements are mixed is formed. Further, even when their distances are different, if they are proximate to a certain degree, there is a high possibility that another non-assumed arrangement AR of the self-assembled dots D is formed.

In other words, when the distances of the positions [n, m], [n', m'] of the two added post guides G from the origin [0, 0] are different to some degree, the occurrence of such a multi-domain structure can be avoided.

Therefore, distances regarding the integers n, m were found and a distance relation was studied. The result thereof is shown in Table 2. In Table 2, the distances regarding the integers n, m up to 12 are calculated.

ference in distance is 5% or less", "the difference in distance is 0.1 or less", and the like. Note that these threshold values are appropriately selected depending on, for example, the specification of a fabricated magnetic recording medium.

Thus forming the unit lattice by adding the two post guides G or more can make it difficult for the mixed arrangement of the self-assembled dots D to be formed.

Figure 21:
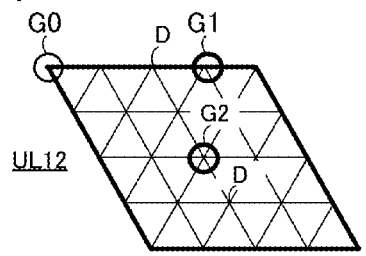
FIG. 21 is a schematic view illustrating an example of a unit lattice.
Figure 22:
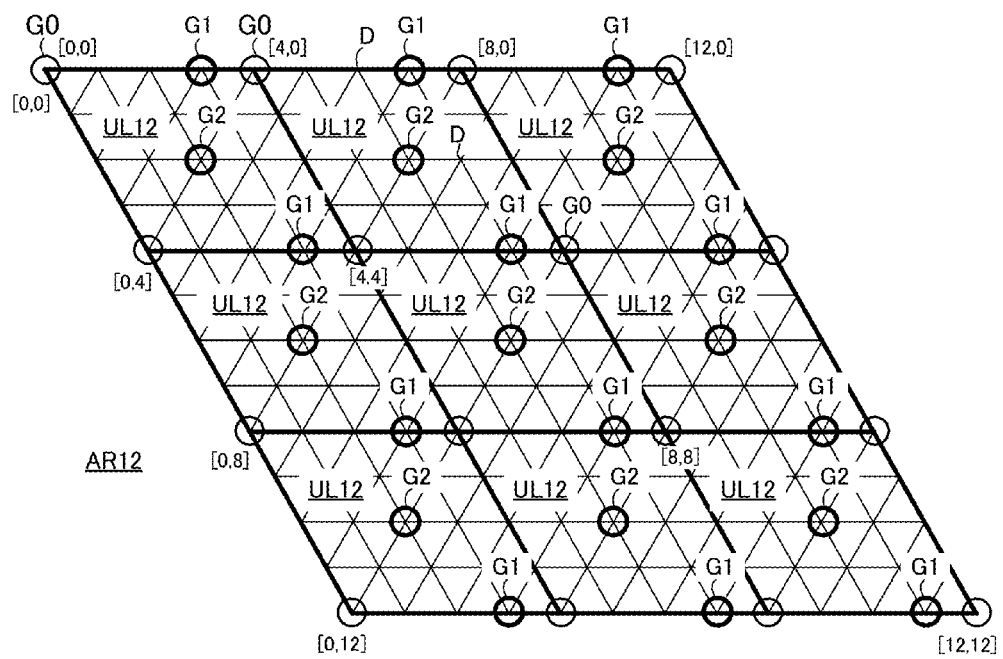
FIG. 22 is a schematic view illustrating an arrangement expressed by the unit lattice.

FIG. 21 and FIG. 22 illustrate a unit lattice UL12 and an arrangement AR12 expressed by the arrangement of the unit lattices UL12. Post guides G1, G2 are disposed at positions [n, m], [n', m'] (here, positions [3, 0], [2, 2]) of the basic unit lattice UL0 having the post guide G.

The combination of the positions [n, m], [n', m'] is decided by the aforesaid threshold value and is one making it difficult for the mixed arrangement of the self-assembled dots D to be formed. A distance from the origin to the position [3, 0] is 3, a distance from the origin to the position [2, 2] is 3.4641, and these distances differ by 0.46 in an absolute value. Therefore, it is thought that the mixture of the arrangements of the self-assembled dots D is difficult to occur.

Figure 20:
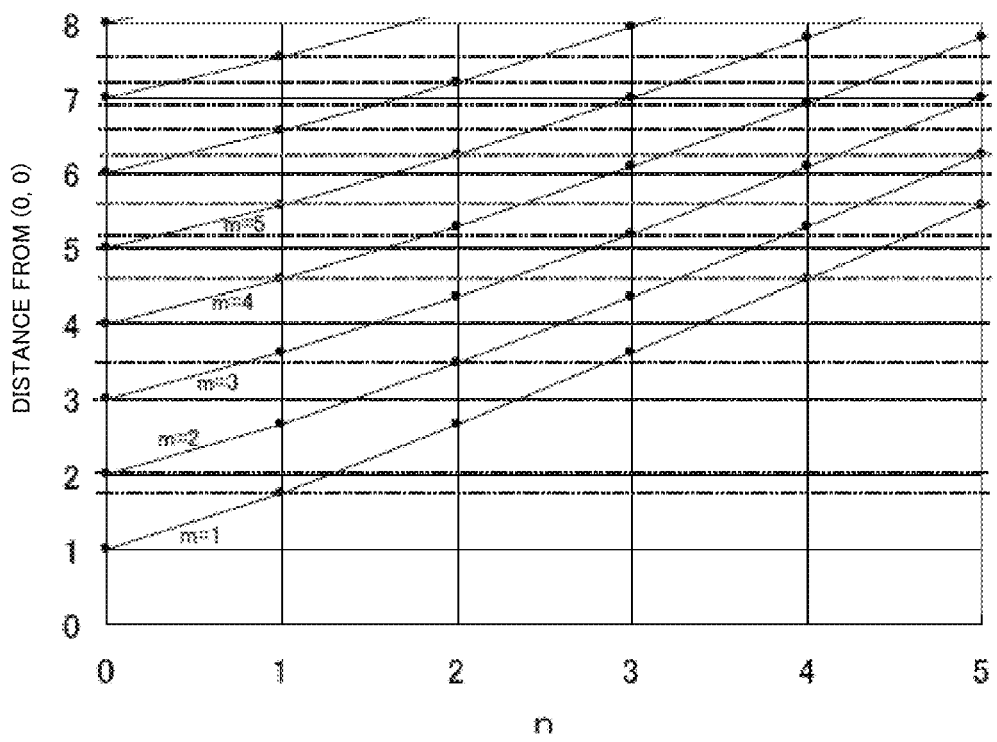
FIG. 20 is a graph representing a relation between position and distance of the post guide.

As is understood from FIG. 20, a difference in distance of the other position [n', m'] is as large as this, and therefore, there is a low possibility that another arrangement of the self-assembled dots D appears.

TABLE 2

| | | | | | | | m | | | | | | |
|---|---|---|---|---|---|---|---|---|---|---|---|---|---|
| n | 0 | 1 | 2 | 3 | 4 | 5 | 6 | 7 | 8 | 9 | 10 | 11 | 12 |
| 0 | 0 | 1 | 2 | 3 | 4 | 5 | 6 | 7 | 8 | 9 | 10 | 11 | 12 |
| 1 | 1 | 1.7321 | 2.6458 | 3.6056 | 4.5826 | 5.5678 | 6.5574 | 7.5498 | 8.544 | 9.5394 | 10.536 | 11.533 | 12.53 |
| 2 | 2 | 2.6458 | 3.4641 | 4.3589 | 5.2915 | 6.245 | 7.2111 | 8.1854 | 9.1652 | 10.149 | 11.136 | 12.124 | 13.115 |
| 3 | 3 | 3.6056 | 4.3589 | 5.1962 | 6.0828 | 7 | 7.9373 | 8.8882 | 9.8489 | 10.817 | 11.79 | 12.767 | 13.748 |
| 4 | 4 | 4.5826 | 5.2915 | 6.0828 | 6.9282 | 7.8102 | 8.7178 | 9.6437 | 10.583 | 11.533 | 12.49 | 13.454 | 14.422 |
| 5 | 5 | 5.5678 | 6.245 | 7 | 7.8102 | 8.6603 | 9.5394 | 10.44 | 11.358 | 12.288 | 13.229 | 14.177 | 15.133 |
| 6 | 6 | 6.5574 | 7.2111 | 7.9373 | 8.7178 | 9.5394 | 10.392 | 11.269 | 12.166 | 13.077 | 14 | 14.933 | 15.875 |
| 7 | 7 | 7.5498 | 8.1854 | 8.8882 | 9.6437 | 10.44 | 11.269 | 12.124 | 13 | 13.892 | 14.799 | 15.716 | 16.643 |
| 8 | 8 | 8.544 | 9.1652 | 9.8489 | 10.583 | 11.358 | 12.166 | 13 | 13.856 | 14.731 | 15.62 | 16.523 | 17.436 |
| 9 | 9 | 9.5394 | 10.149 | 10.817 | 11.533 | 12.288 | 13.077 | 13.892 | 14.731 | 15.588 | 16.462 | 17.349 | 18.248 |
| 10 | 10 | 10.536 | 11.136 | 11.79 | 12.49 | 13.229 | 14 | 14.799 | 15.62 | 16.462 | 17.325 | 18.193 | 19.079 |
| 11 | 11 | 11.533 | 12.124 | 12.767 | 13.454 | 14.177 | 14.933 | 15.716 | 16.523 | 17.349 | 18.193 | 19.053 | 19.925 |
| 12 | 12 | 12.53 | 13.115 | 13.748 | 14.422 | 15.133 | 15.875 | 16.643 | 17.436 | 18.248 | 19.079 | 19.925 | 20.785 |

In FIG. 20, the results regarding the integers n, m up to 5 are graphed. In FIG. 20, the horizontal axis represents the integer n, and the distance for each integer m is represented by a black circle on the vertical axis. For easier understanding, the black circles for the same integer m are connected. Near the connecting line, the corresponding integer m is appended.

As is seen from FIG. 20, the distance of a position [1, 3] and a position [3, 1] is different from the distance of a position [2, 2] but their difference is small. Therefore, there is a possibility that the post guide G disposed at the position [2, 2] also acts as the post guide G for the arrangements of the self-assembled dots D lined up in the directions of the position [1, 3] and the position [3, 1] (slightly rotated arrangements). Therefore, there is a possibility that an arrangement where the plural arrangements of the self-assembled dots D are mixed is formed.

Therefore, by selecting the positions [n, m], [n', m'] of the post guides G1, G2 so that a difference between the distances of the post guides G1, G2 and the origin does not satisfy a predetermined threshold value, it is possible to make it difficult for the mixed arrangement of the self-assembled dots D to be formed. Examples of this threshold value are "the dif- In this manner, it is possible to obtain the arrangement of the post guides G that makes it difficult for the mixed arrangement of the self-assembled dots D to be formed (refer to FIG. 22).

(Arrangement of Plurality of Unit Lattices)

The difference in distance illustrated in the example in FIG. 22 can also possibly cause the mixture of the arrangements of the self-assembled dots D. A possible measure to prevent this is to use a plurality of unit lattices.

Figure 23:
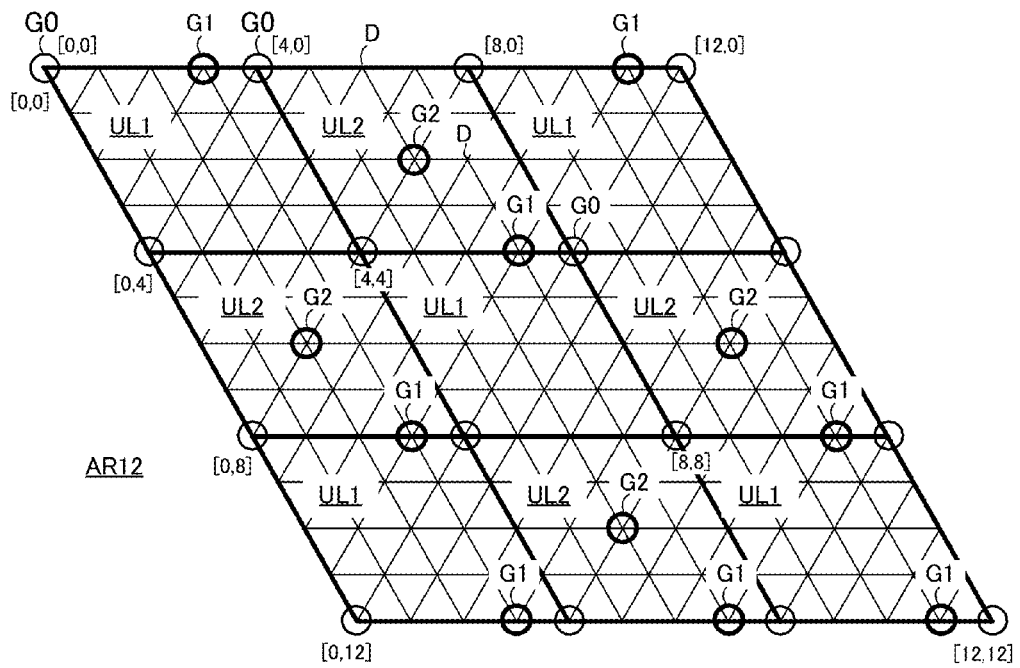
FIG. 23 is a schematic view illustrating an arrangement expressed by a plurality of unit lattices.
Figure 24:
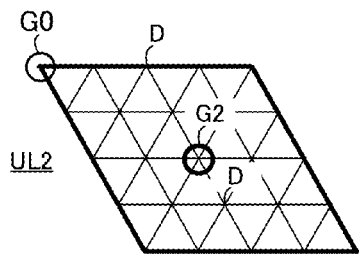
FIG. 24 is a schematic view illustrating an example of the unit lattice.

An example thereof is illustrated in FIG. 23. As a result of alternately arranging unit lattices UL1, UL2 (refer to FIG. 18 and FIG. 24), an arrangement AR12 is formed. Post guides G included in each of the unit lattices UL1, UL2 are disposed at two places, namely, the origin and a position [n, m]. In the unit lattices UL1, UL2, the post guides G1, G2 are disposed at positions [3, 0], [2, 2] respectively in addition to the origin.

By arranging the plural kinds of unit lattices, it is possible to more reduce the possibility of the mixture of the arrangements of the self-assembled dots D than by arranging the same unit lattices. Here, the unit lattices UL1, UL2 are regularly arranged, but this arrangement may be random.

Figure 25:
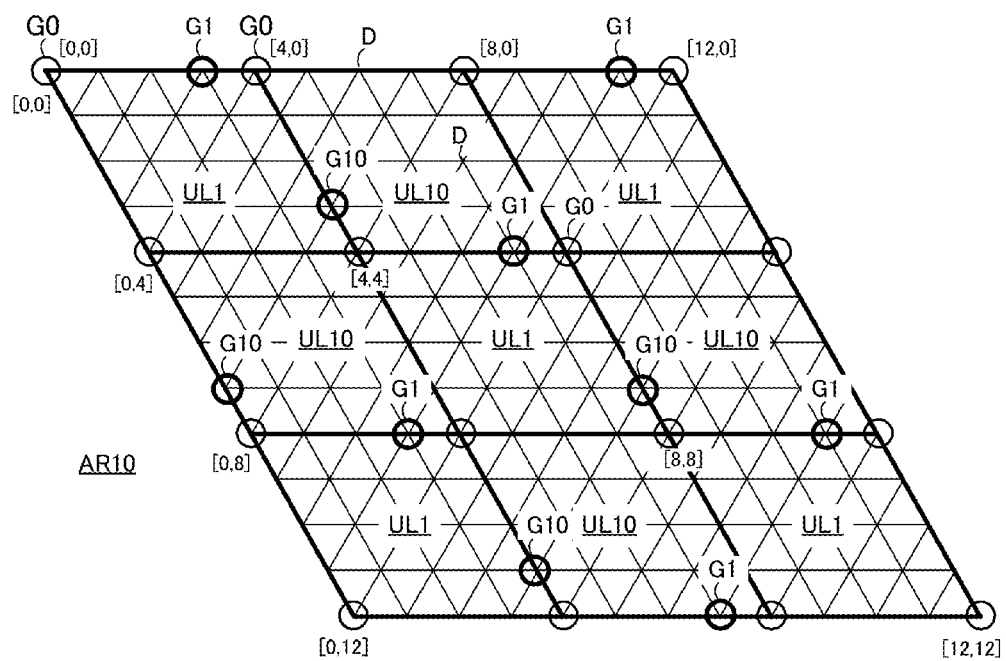
FIG. 25 is a schematic view illustrating an arrangement expressed by a plurality of unit lattices.
Figure 26:
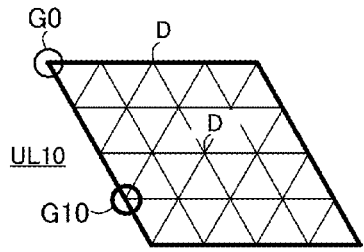
FIG. 26 is a schematic view illustrating an example of the unit lattice.

Another example is illustrated in FIG. 25. By alternately disposing unit lattices UL1, UL10 (refer to FIG. 18 and FIG.

26), an arrangement AR10 is formed. In the unit lattices UL1, UL10, post guides G1, G10 are disposed at positions [3, 0], [0, 3] respectively. The unit lattice UL10 is a rotated unit lattice UL1.

Here, by arranging the unit lattice UL1 including the post guides G at the position [3, 0] in addition to the origin and the unit lattice UL10 which is the rotated unit lattice UL1, it is possible to prevent the mixture of the arrangements of the self-assembled dots D.

Figure 27:
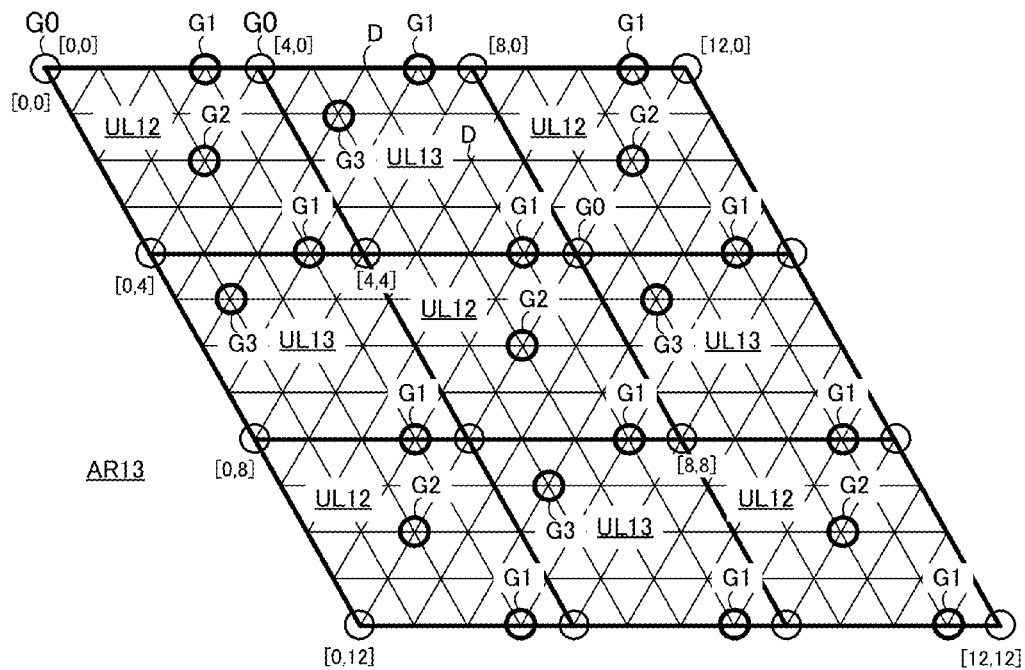
FIG. 27 is a schematic view illustrating an arrangement expressed by a plurality of unit lattices.
Figure 28:
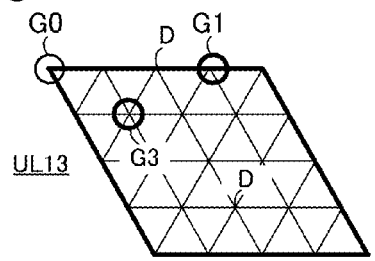
FIG. 28 is a schematic view illustrating an example of the unit lattice.

Still another example is illustrated in FIG. 27. By alternately disposing unit lattices UL12, UL13 (refer to FIG. 21 and FIG. 28), an arrangement AR13 is formed. The unit lattices UL12, UL13 each include two positional post guides G disposed respectively at positions [3, 0] [2, 2] and at positions [3, 0] and [1, 1] which are different in distance from the origin. As a result, it is possible to further effectively prevent the mixture of the arrangements of the self-assembled dots D.

As described above, according to this embodiment, it is possible to control the dot arrangement over a wide area without increasing accuracy and density of the post guides G.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A stamper for creating a bit patterned medium, the stamper comprising:
    a base portion having a main surface; and
    a plurality of guides arranged on the main surface in mutually different first and second directions and serving as references of arrangement of a plurality of self-assembled dots,
    wherein a distance between the guides in a third direction is within a range of an integer $m_1$ ±0.05 times of a pitch of the plural self-assembled dots, the third direction corresponding to a third vector obtained by combining a first vector corresponding to the arrangement of the guides in the first direction and a second vector corresponding to the arrangement of the guides in the second direction; and
    wherein a distance between the plural guides in the first direction falls out of a range of an integer $m_2$ ±0.15 times of the pitch of the plural self-assembled dots.

2. The stamper according to claim 1,
    wherein the distance between the guides in the first direction and a distance between the guides in the second direction are substantially equal to each other.

3. The stamper according to claim 2,
    wherein the distance is within a range of about 2.7±0.05 times, 3.8±0.05 times, 4.6±0.05 times, 5.2±0.05 times, 5.8±0.05 times, 6.8±0.05 times, or 7.0±0.05 times of the pitch of the self-assembled dots.

4. The stamper according to claim 1,
    wherein an angle made by the first direction and the second direction is within a range of 60°±10°.

5. The stamper according to claim 1,
    wherein the guides are projections or pits.

6. A stamper for creating a bit patterned medium, the stamper comprising:
    a base portion having a main surface; and
    a plurality of guides arranged on the main surface in mutually different first and second directions and serving as references of arrangement of a plurality of self-assembled dots,
    wherein a distance between the plural guides in the first direction is within a range of 7.0±0.05 times, 9.0±0.05 times, or 13.0±0.05 times of a pitch of the plural self-assemble dots.

7. The stamper according to claim 6,
    wherein the distance between the guides in the first direction and a distance between the guides in the second direction are substantially equal to each other.

8. The stamper according to claim 6,
    wherein an angle made by the first direction and the second direction is within a range of 60°±10°.

9. The stamper according to claim 6,
    wherein the guides are projections or pits.

10. A method of manufacturing a bit patterned medium, the method comprising:
    bringing the stamper according to claim 1 into contact with a resin layer formed on a substrate;
    curing the resin layer with which the stamper is in contact;
    separating the stamper from the cured resin layer to form a resin layer having convexity and concavity corresponding to convexity and concavity of the stamper;
    applying a self-assembling material on the resin layer;
    self-assembling the self-assembling material to form a first phase disposed in correspondence to the guides of the stamper and a second phase covering the first phase;
    etching the second phase and the resin layer to leave the first phase; and
    etching the substrate with the first phase used as a mask.

11. A method of manufacturing a bit patterned medium, the method comprising:
    bringing the stamper according to claim 6 into contact with a resin layer formed on a substrate;
    curing the resin layer with which the stamper is in contact;
    separating the stamper from the cured resin layer to form a resin layer having convexity and concavity corresponding to convexity and concavity of the stamper;
    applying a self-assembling material on the resin layer;
    self-assembling the self-assembling material to form a first phase disposed in correspondence to the guides of the stamper and a second phase covering the first phase;
    etching the second phase and the resin layer to leave the first phase; and
    etching the substrate with the first phase used as a mask.

* * * * *

UNITED STATES PATENT AND TRADEMARK OFFICE
CERTIFICATE OF CORRECTION

| | | |
|---|---|---|
| PATENT NO. | : 9,064,522 B2 | Page 1 of 1 |
| APPLICATION NO. | : 14/167464 | |
| DATED | : June 23, 2015 | |
| INVENTOR(S) | : Kanamaru et al. | |

It is certified that error appears in the above-identified patent and that said Letters Patent is hereby corrected as shown below:

Title page, item (57), in the Abstract, line 7, change "the plural self-assembled dots" to --the plurality of self-assembled dots--.

Title page, item (57), in the Abstract, line 13, change "the plural self-assembled dots" to --the plurality of self-assembled dots--.

Claims

Claim 1, column 15, line 43, change "the plural self-assembled dots" to --the plurality of self-assembled dots--.

Claim 1, column 15, line 51, change "the plural self-assembled dots" to --the plurality of self-assembled dots--.

Signed and Sealed this
Eighth Day of March, 2016

Michelle K. Lee
*Director of the United States Patent and Trademark Office*